United States Patent
Sun et al.

(10) Patent No.: US 6,863,077 B2
(45) Date of Patent: Mar. 8, 2005

(54) METHOD AND APPARATUS FOR ENHANCED CHAMBER CLEANING

(75) Inventors: Sheng Sun, Fremont, CA (US); Quanyuan Shang, Saratoga, CA (US); William R. Harshbarger, San Jose, CA (US); Robert I. Greene, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 160 days.

(21) Appl. No.: 10/195,718

(22) Filed: Jul. 15, 2002

(65) Prior Publication Data

US 2002/0174885 A1 Nov. 28, 2002

Related U.S. Application Data

(62) Division of application No. 09/494,581, filed on Jan. 31, 2000, now Pat. No. 6,432,255.

(51) Int. Cl.[7] .................................................. C25F 3/00
(52) U.S. Cl. ............................. 134/1.1; 134/2; 134/21; 134/22.1; 134/22.11; 216/37; 216/67
(58) Field of Search .............................. 134/1.1, 2, 21, 134/22.1, 22.11; 216/37, 58, 67

(56) References Cited

U.S. PATENT DOCUMENTS

| | | | |
|---|---|---|---|
| 3,717,439 A | * | 2/1973 | Sakai ........................ 118/715 |
| 5,277,740 A | | 1/1994 | Yoneda |
| 5,362,328 A | * | 11/1994 | Gardiner et al. ............ 118/726 |
| 5,904,800 A | | 5/1999 | Mautz |
| 6,110,283 A | | 8/2000 | Yamamuka et al. |
| 6,283,060 B1 | | 9/2001 | Yamazaki et al. |

FOREIGN PATENT DOCUMENTS

JP    03 185723 A2    8/1991

* cited by examiner

*Primary Examiner*—Allan Olsen
(74) *Attorney, Agent, or Firm*—Dugan & Dugan

(57) ABSTRACT

A system for processing substrates within a chamber and for cleaning accumulated material from chamber components is provided. The system includes a reactive species generator adapted to generate a reactive gas species for chemically etching accumulated material from chamber components, and a processing chamber having at least one component with a mirror polished surface which is exposed to the reactive species. Preferably to have the greatest impact on chamber cleaning efficiency, the mirror polished surface is a surface of a component such as a gas distribution plate or a backing plate, and/or is a surface of a plurality of smaller components (e.g., chamber wall liners, a gas conductance line, etc.) so as to constitute a large percentage of the surface area exposed to the reactive species. Most preferably all bare aluminum surfaces which the reactive species contacts are mirror polished.

8 Claims, 1 Drawing Sheet

METHOD AND APPARATUS FOR ENHANCED CHAMBER CLEANING

This application is a division of U.S. patent application Ser. No. 09/494,581, filed Jan. 31, 2000, now U.S. Pat. No. 6,432,255, which is hereby incorporated by reference herein in its entirety.

FIELD OF THE INVENTION

The present invention relates to an improved method and apparatus for enhancing chamber cleaning rates. More specifically, the present invention relates to a method and apparatus for enhancing the effective etch rate of a reactive chemical species which etches accumulated materials from processing chamber components.

BACKGROUND OF THE INVENTION

The manufacture of liquid crystal displays, flat panel displays, thin film transistors and other semiconductor devices occurs within a plurality of chambers, each of which is designed to perform a specific process on the substrate. Many of these processes can result in an accumulation of material (e.g., material deposited on the substrate in layers, such as by chemical vapor deposition, physical vapor deposition, thermal evaporation, material etched from substrate surfaces, and the like) on chamber surfaces. Such accumulated material can crumble from the chamber surfaces and contaminate the sensitive devices being processed therein. Accordingly, process chambers must be cleaned of accumulated materials frequently (e.g., every 1–6 substrates).

To clean chamber surfaces, an in-situ dry cleaning process is preferred. In an in-situ dry cleaning process one or more gases are dissociated within the processing chamber to form one or more reactive gas species (e.g., fluorine ions, radicals). The reactive species clean chamber surfaces by forming volatile compounds with the material accumulated on those surfaces. Such an in-situ cleaning process reduces both particle counts and the system down time required for more interruptive cleaning processes which require the chamber to be opened.

Remote Plasma Source Cleaning (RPSC) is a further improvement to the in-situ plasma clean. In a RPSC, cleaning gas(es) are dissociated in a separate chamber, and the dissociated reactive species are then flowed downstream into the processing chamber where they clean/etch material from chamber surfaces. RPSC fully dissociates the cleaning gas and thus provides significant savings both monetarily and environmentally. In addition, RPSC reduces chamber consumables by eliminating the detrimental ion-bombardment associated with in-situ plasma cleaning processes.

Unfortunately, as described further below, both insitu cleaning and remote plasma source cleaning processes conventionally require considerable time and consume considerable amounts of cleaning gases, and thus undesirably increase the cost per substrate processed within a processing chamber. Further, in Remote Plasma Source Cleaning (RPSC) large cleaning rate variations often are observed between processing chambers cleaned by identical cleaning processes. Accordingly, there is a need for an improved method and apparatus for etching accumulated material from chamber surfaces.

SUMMARY OF THE INVENTION

The present inventors have discovered that chamber cleaning rates increase when chamber surfaces exposed to reactive cleaning gas species are mirror polished. Preferably the chamber surfaces are untreated, and most preferably are untreated aluminum. As used herein, an untreated chamber surface is one that has not been previously treated to enhance cleaning (e.g., by anodization or by applying a coating such as that disclosed in U.S. patent application Ser. No. 09/322,893, filed May 29, 1999). Such treated chamber surfaces already exhibit good cleaning rates. Mirror polishing is a process that reduces the surface roughness of a part, and therefore reduces surface area. The present inventors believe that mirror polishing achieves two goals, (i) reducing a part's surface area so as to reduce the total number of sites at which the cleaning radical deactivation process occurs; (ii) removing surface contaminants which may otherwise bond with and reduce the number of cleaning radicals. Therefore, mirror polishing is believed to preserve cleaning radicals and render RPSC more effective.

The present invention comprises a system for processing substrates within a chamber and for cleaning accumulated material from chamber components. The system includes a processing chamber and a reactive species generator adapted to generate a reactive gas species for chemically etching accumulated material from chamber components, and at least one mirror polished surface or component which is exposed to the reactive species during the cleaning process. Preferably to have the greatest impact on chamber cleaning efficiency, the at least one mirror polished component(s) is a large component such as a gas distribution plate or a backing plate, and/or a plurality of smaller components (e.g., the chamber's shadow frame, wall liners, susceptor, gas conductance line, etc.) so as to constitute a large percentage of the surface area exposed to the reactive species.

By mirror polishing surfaces exposed to the reactive species, not only have cleaning rate enhancements been observed, cleaning rate variations between processing chambers can be significantly reduced, process chamber throughput significantly increased and the amount of precursor gas required for cleaning reduced. Because of the high costs associated with precursor gases such as $NF_3$, both monetarily and environmentally (e.g., global warming), any reduction in precursor gas consumption is beneficial. Moreover, mirror polished surfaces do not introduce any foreign material into the processing system, and do not present the adhesion problems experienced by most conventional surface treatments.

Other objects, features and advantages of the present invention will become more fully apparent from the following detailed description of the preferred embodiments, the appended claims and the accompanying drawing.

DETAILED DESCRIPTION OF THE PREFERRED EMBODIMENTS

Figure 1:
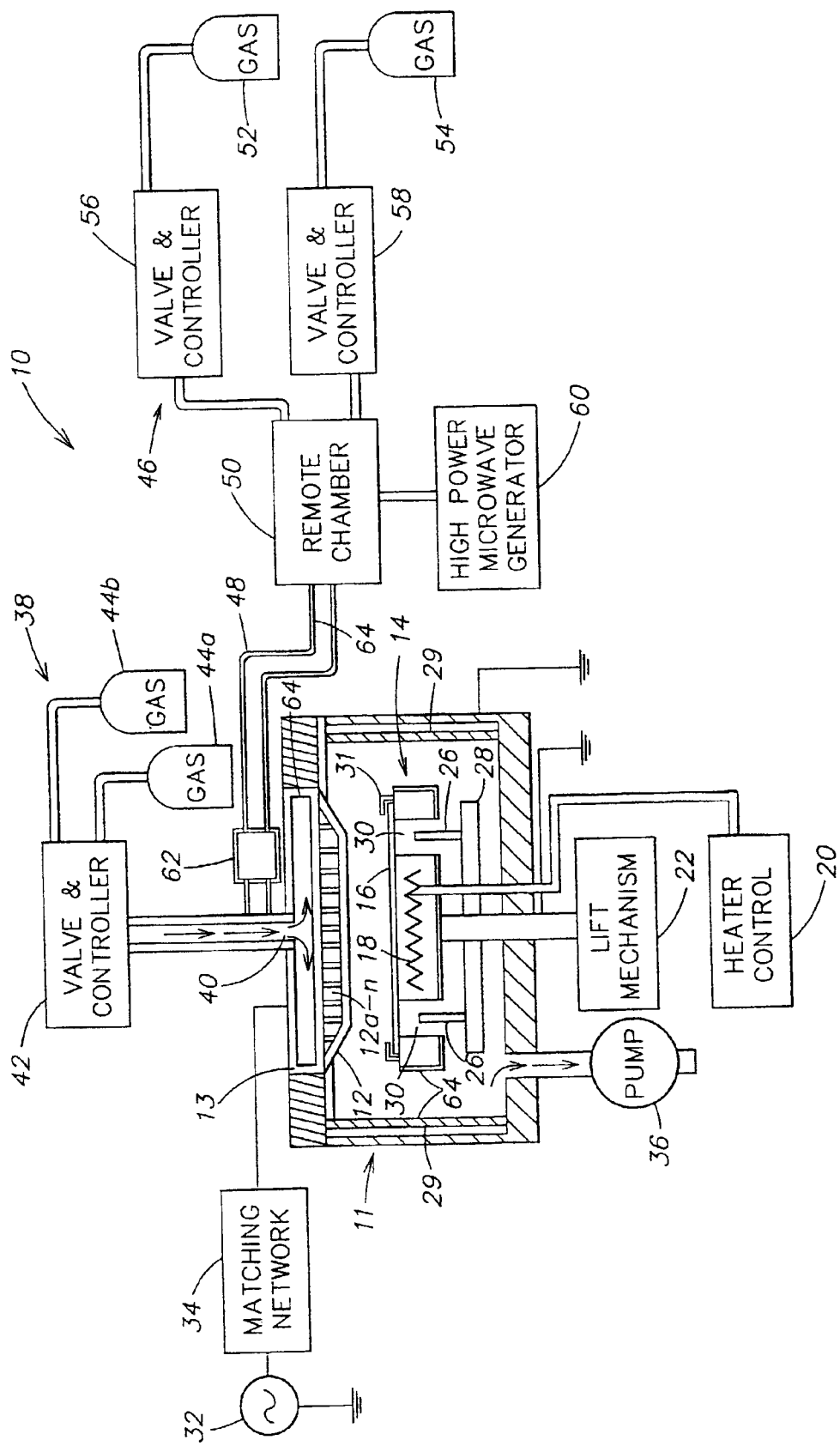
FIG. 1 is a side elevational view of a processing system configured in accordance with the present invention.

FIG. 1 is a side elevational view of a processing system 10 configured in accordance with the present invention. Any suitable processing system may be modified as described herein such as a model AKT-1600 PECVD System manufactured by Applied Kamatsu Technology and described in U.S. Pat. No. 5,788,778, which is hereby incorporated by reference herein in its entirety, the GIGAFILL™ processing system manufactured by Applied Materials, Inc. and described in U.S. Pat. No. 5,812,403, which is hereby incorporated by reference herein in its entirety, thermal deposition chambers and the like. For convenience an AKT-1600 PECVD processing system 10 configured in accordance with the present invention is shown in FIG. 1. The AKT-1600 PECVD processing system 10 is designed for fabricating active-matrix liquid crystal displays and may be used to deposit amorphous silicon, silicon dioxide, silicon oxynitrides and silicon nitride as is known in the art.

With reference to FIG. 1, the processing system 10 comprises a deposition chamber 11 having a gas distribution plate 12 with apertures 12a–n and a backing plate 13 adapted to deliver processing gases and cleaning gases into the deposition chamber 11, and a susceptor 14 for supporting a substrate 16 to be processed within the deposition chamber 11. The susceptor 14 includes a heater element 18 (e.g., a resistive heater) coupled to a heater control 20 for elevating the temperature of the substrate 16 to a processing temperature and for maintaining the substrate 16 at the processing temperature during processing. A lift mechanism 22 is coupled to the susceptor 14 to allow the substrate 16 to be lifted from the susceptor 14, as described below. Specifically, a plurality of lift pins 26 (fixedly held by a lift pin holder 28) penetrate the susceptor 14 (through a plurality of lift pin apertures 30) so as to contact and lift the substrate 16 from the susceptor 14 when the susceptor 14 is lowered by the lift mechanism 22. The deposition chamber 11 further comprises a chamber wall liner 29 which blocks material from accumulating on the chamber wall and which can be removed and cleaned, and a shadow frame 31 which overhangs the substrate's edge and thereby prevents material from depositing or accumulating on the substrate's edge.

In addition to their above described functions, the gas distribution plate 12 and the susceptor 14 also serve as parallel plate upper and lower electrodes, respectively, for generating a plasma within the deposition chamber 11. For example, the susceptor 14 may be grounded and the gas distribution plate 12 coupled to an RF generator 32 via a matching network 34. An RF plasma thereby may be generated between the gas distribution plate 12 and the susceptor 14 through application of RF power supplied thereto by the RF generator 32 via the matching network 34. A vacuum pump 36 is coupled to the deposition chamber 11 for evacuating/pumping the same before, during or after processing as required.

The processing system 10 further comprises a first gas supply system 38 coupled to an inlet 40 of the deposition chamber 11 for supplying processing gases thereto through the backing plate 13 and the gas distribution plate 12. The first gas supply system 38 comprises a valve controller system 42 (e.g., computer controlled mass flow controllers, flow meters, etc.) coupled to the inlet 40 of the deposition chamber 11, and a plurality of process gas sources 44a, 44b coupled to the valve controller system 42. The valve controller system 42 regulates the flow of processing gases to the deposition chamber 11. The specific processing gases employed depend on the materials being deposited within the deposition chamber 11.

In addition to the first gas supply system 38, the processing system 10 comprises a second gas supply system 46 coupled to the inlet 40 of the deposition chamber 11 (via a gas conductance line 48) for supplying cleaning gases thereto during cleaning of the deposition chamber 11 (e.g., to remove accumulated material from the various interior surfaces of the chamber 11). The second gas supply system 46 comprises a remote plasma chamber 50 coupled to the gas conductance line 48 and a precursor gas source 52 and a minor carrier gas source 54 coupled to the remote plasma chamber 50 via a valve controller system 56 and a valve controller system 58, respectively. Typical precursor cleaning gases include $NF_3$, $CF_4$, $SF_6$, $C_2F_6$, $CCl_4$, $C_2Cl_6$, etc., as are well known in the art. The minor carrier gas, if employed, may comprise any non-reactive gas compatible with the cleaning process being employed (e.g., argon, helium, hydrogen, nitrogen, oxygen, etc.). The precursor and minor carrier gas sources 52, 54 may comprise a single gas source if desired, containing an appropriate mixture of the precursor and minor carrier gases.

A high power source generator 60 (e.g., a microwave or RF generator) supplies power to the remote plasma chamber 50 to ignite and maintain a plasma within the remote plasma chamber 50 (as described below) where the cleaning gas is dissociated into active cleaning species/radicals. A flow restrictor 62 preferably is placed along the gas conductance line 48 to allow a pressure differential to be maintained between the remote plasma chamber 50 and the deposition chamber 11.

During cleaning of the deposition chamber 11, a precursor gas is delivered to the remote plasma chamber 50 from the precursor gas source 52. The flow rate of the precursor gas is set by the valve controller system 56. The high power generator 60 delivers power to the remote plasma chamber 50 and activates the precursor gas to form one or more reactive species (e.g., fluorine radicals) which travel to the deposition chamber 11 through the gas conductance line 48. The remote plasma chamber 50 thus serves as a "reactive species generator" that is coupled to the deposition chamber 11 and delivers reactive species thereto. Note that the susceptor 14 and the gas distribution plate 12 also may serve as a reactive species generator coupled to the deposition chamber 11 as the RF power applied therebetween may dissociate the precursor gas.

The one or more reactive species generated by the remote plasma chamber 50 travel through the inlet 40, through the backing plate 13, through the gas distribution plate 12 and into the deposition chamber 11. A minor carrier gas may be supplied to the remote plasma chamber 50 from the minor carrier gas source 54 to aid in transport of the one or more reactive species to the chamber 11 and/or to assist in chamber cleaning or plasma initiation/stabilization within the deposition chamber 11 if an RF plasma is employed during chamber cleaning.

Exemplary cleaning process parameters for the deposition chamber 11 when an $NF_3$ precursor cleaning gas is employed include a precursor gas flow rate of about 2 liters per minute and a deposition chamber pressure of about 0.5 Torr. A microwave power of 3–12 kW, preferably 5 kW, is supplied to the remote plasma chamber 50 by the high power microwave generator 60 to activate the $NF_3$ precursor gas. Preferably the remote plasma chamber 50 is held at a pressure of at least 4.5 Torr and preferably about 6 Torr. Other cleaning process parameter ranges/chemistries are described in previously incorporated U.S. Pat. No. 5,788,778.

As previously described, common problems with conventional cleaning processes include low cleaning rates and large variations in cleaning rates between process chambers. The present inventors have discovered that cleaning rates and cleaning rate variations between chambers are dependent on the internal chamber surface condition, and that all internal surfaces between a remote plasma source (e.g., remote plasma chamber 50) and a chamber (e.g., deposition chamber 11) ("downstream surfaces") affect cleaning rates. Specifically, a surface controlled deactivation process is believed to cause reactive species employed during cleaning (e.g., active etchant species such as F radicals) to combine to form non-reactive species (e.g., $F_2$ in the case of F radicals) which do not assist in chamber cleaning. This surface controlled deactivation process appears to occur at any untreated material surface, including both bare and anodized aluminum surfaces.

The present inventors have found that by mirror polishing one or more untreated downstream components, higher cleaning rates are achieved and cleaning rate variations between chambers are greatly reduced. Mirror polished components believed to significantly affect cleaning performance include a chamber's gas distribution plate and backing plate. In order to affect an improvement in chamber cleaning rates, a certain percentage of the chamber components should be mirror polished. Although this percentage may vary, higher percentages are preferred to achieve faster cleaning rates, with 100% mirror polishing of untreated exposed surfaces being most preferred. Note that an increase in cleaning rate (e.g., up to 15%) also can be achieved by using an RF plasma within a processing chamber in conjunction with a remote plasma source, i.e., by powering electrode 12 to form the radicalized gases entering from the remote plasma source, or by secondarily introducing cleaning gases into a plasma. However, applied RF power should be limited to avoid damage to processing chamber components due to ion bombardment.

With reference to the processing system 10 of FIG. 1, to affect increased cleaning rate and reduced cleaning rate variations between the deposition chamber 11 and other deposition chambers (not shown), the exposed treated or untreated surfaces of one or more downstream components of the processing system 10 are mirror polished ("mirror polished surfaces 64"). Mirror polishing is a process known to workers of ordinary skill in the art, and is commonly employed to polish optical lenses and semiconductor substrates. Generally, mirror polishing involves the application of an abrasive slurry to a pad which contacts the surface to be polished, and is in relative motion therewith.

As shown in FIG. 1, the interior surfaces of the deposition chamber 11, the gas distribution plate 12, the backing plate 13, the susceptor 14, the inlet 40, the gas conductance line 48, the chamber wall liner 29 and the shadow frame 31 are mirror polished surfaces 64. Fewer components may be mirror polished if desired. However, because bare aluminum surfaces typically cannot be successfully treated with coatings that increase cleaning efficiency (due to flaking/peeling), it is envisioned that the most advantageous application of the mirror polished surface 64 is on bare aluminum surfaces. Mirror polishing of anodized aluminum (e.g., conventionally the susceptor and shadow frame are anodized aluminum) may be inadvisable due to the possibility of removing the anodization layer and thereby interfering with the deposition process or causing arcing, etc.

With respect to the PECVD deposition chamber 11 of FIG. 1, the mirror polished surfaces 64 significantly increase the cleaning rate and significantly reduce chamber-to-chamber cleaning rate variations while neither producing processing drift nor change in the properties of PECVD films deposited within the deposition chamber 11. The mirror polished surfaces 64 reduce the total surface area to which the cleaning radicals are exposed and thus reduce the number of surface adsorption sites at which the surface controlled deactivation process is believed to occur (e.g., maintaining a high and a uniform F radical concentration).

When cleaning an approximately 10,000 Angstroms silicon nitride film, a 15.6% cleaning rate improvement was observed with an AKT PECVD 3500 chamber which employed an anodized diffuser and a backing plate that was first machined to eight micro inches, and then mirror polished to two micro inches and cleaned. When cleaning an approximately 10,000 Angstroms silicon nitride film, a 6.8% cleaning rate improvement was observed with an AKT PECVD 3500 chamber which employed an anodized, Teflon-coated diffuser and a backing plate that was first machined to eight micro inches, and then mirror polished to two micro inches and cleaned. Fluoropolymer coatings such as Teflon are disclosed in U.S. patent application Ser. No. 09/322,893 (3622/AKT) the entire disclosure of which is incorporated herein by this reference. Accordingly, process chamber throughput increases with use of the present invention, and the amount of precursor gas required for cleaning is reduced.

Because of the high costs associated with precursor gases such as $NF_3$, both monetarily (e.g. $NF_3$ presently costs $100/lb) and environmentally (e.g., $NF_3$ is a "global warming" gas,) reduction in precursor gas consumption is extremely beneficial. Moreover, mirror polished surfaces are inexpensive and easy to produce, unlike many of the surface coatings (e.g., $AlF_3$) which conventionally have been applied to prevent corrosion of chamber surfaces or to prevent accumulated material from crumbling therefrom. Finally, the present invention also is expected to reduce cleaning rate variations between processing chambers.

The foregoing description discloses only the preferred embodiments of the invention, modifications of the above disclosed apparatus and method which fall within the scope of the invention will be readily apparent to those of ordinary skill in the art. For instance, while the present invention has been described with reference to a PECVD chamber, it will be understood that the invention has applicability to a wide variety of process chambers including thermal deposition chambers. Additionally, cleaning processes employing reactive species (e.g., reactive species generated by an RF plasma within a process chamber, or remote plasma source generated reactive species etc.) may be improved by employing the mirror polished surface described herein. Finally, although any mirror polish is believed to enhance cleaning when employed on downstream surfaces, a mirror polish of two micro inches has been found to significantly enhance cleaning and is therefore preferred.

Accordingly, while the present invention has been disclosed in connection with the preferred embodiments thereof, it should be understood that other embodiments may fall within the spirit and scope of the invention, as defined by the following claims.

The invention claimed is:

1. A method of cleaning a processing chamber via a reactive species which chemically etches accumulated materials from chamber components, the method comprising:
   providing a processing chamber adapted to perform a process by which material accumulates on chamber components;
   supplying the processing chamber with at least one component having a surface that has a mirror polish surface roughness of two micro inches; and
   cleaning the processing chamber with a reactive species which chemically etches accumulated material from chamber components;
   wherein the mirror polished surface is exposed to the reactive species.

2. The method of claim 1 wherein the mirror polished surface is aluminum.

3. A method of cleaning a processing chamber via a reactive species which chemically etches accumulated materials from chamber components, the method comprising:

provimg a processing system having a processing chamber adapted to perform a process by which material accumulates on chamber components;

providing a reactive species generator adapted to generate a reactive species for chemically etching accumulated material;

supplying a gas conductance line between the reactive species generator and the processing chamber, the gas conductance line adapted to conduct a reactive species from the reactive species generator to the processing chamber and having a mirror polished surface with a surface roughness of 2 micro inches; and cleaning the processing chamber with a reactive species which chemically etches accumulated material from chamber components;

wherein the mirror polished surface is exposed to the reactive species.

4. A method of cleaning a processing chamber via a reactive species which chemically etches accumulated materials from chamber components, the method comprising:

providing a processing chamber adapted to perform a process by which material accumulates on chamber components;

supplying the processing chamber with a chamber wall liner having a mirror polished surface, with a surface roughness of 2 micro inches, which is exposed to reactive species during cleaning; and cleaning the processing chamber with a reactive species which chemically etches accumulated material from chamber components.

5. A method of cleaning a processing chamber via a reactive species which chemically etches accumulated materials from chamber components, the method comprising:

providing a processing chamber adapted to perform a process by which material accumulates on chamber components;

supplying the processing chamber with a backing plate adapted to distribute gas as the gas flows into the processing chamber and positioned behind a gas distribution plate, the backing plate having a base with a mirror polished interior surface, with a surface roughness of 2 micro inches, that is exposed to gas as gas enters the processing chamber; and cleaning the processing chamber with a reactive species which chemically etches accumulated material from chamber components.

6. The method of claim 5 wherein the base comprises bare aluminum and the mirror polished surface comprises aluminum.

7. A method of cleaning a processing chamber via a reactive species which chemically etches accumulated materials from chamber components, the method comprising:

providing a processing chamber adapted to perform a process by which material accumulates on chamber components;

supplying the processing chamber with a gas distribution plate adapted to distribute gas as the gas flows into the processing chamber, the gas distribution plate comprising a base having:
  a plurality of apertures formed therethrough; and
  a surface having a mirror polish surface roughness of two micro inches; and cleaning the processing chamber with a reactive species which chemically etches accumulated material from chamber components;

wherein the mirror polished surface is exposed to the reactive species.

8. The method of claim 7 wherein the base comprises bare aluminum, and the mirror polished surface comprises aluminum.

* * * * *